United States Patent [19]
Jang et al.

[11] Patent Number: 5,970,325
[45] Date of Patent: Oct. 19, 1999

[54] THIN-FILM SWITCHING DEVICE HAVING CHLORINE-CONTAINING ACTIVE REGION AND METHODS OF FABRICATION THEREFOR

[75] Inventors: Jin Jang; Keun-soo Lee, both of Seoul; Jong-hyun Choi, Kyungki-do, all of Rep. of Korea

[73] Assignee: Samsung Electronics Co., Ltd., Rep. of Korea

[21] Appl. No.: 08/858,974

[22] Filed: May 20, 1997

[30] Foreign Application Priority Data

May 28, 1996 [KR] Rep. of Korea ............... 96-18083

[51] Int. Cl.$^6$ ................................. H01L 29/78
[52] U.S. Cl. ..................... 438/149; 257/56; 257/66
[58] Field of Search ................. 438/149; 257/66, 257/56, 58; 148/1.5

[56] References Cited

U.S. PATENT DOCUMENTS

| | | |
|---|---|---|
| 4,196,438 | 4/1980 | Carlson . |
| 4,902,638 | 2/1990 | Muto . |
| 4,994,866 | 2/1991 | Awano . |
| 5,417,770 | 5/1995 | Saitoh et al. . |
| 5,655,691 | 8/1997 | Arai et al. . |

OTHER PUBLICATIONS

Hirano et al., "A 33–cm–Diagonal High–Resolution TFT–LCD With Fully Self–Aligned a–Si TFTs", IEICE Trans. Electron., vol. E79–C, No, 8, Aug. 1996, pp. 1103–1108.

*Primary Examiner*—Chandra Chaudhari
*Assistant Examiner*—Martin Sulsky
*Attorney, Agent, or Firm*—Myers Bigel Sibley & Sajovec

[57] ABSTRACT

A thin-film switching device includes an active region including noncrystalline silicon, e.g., hydrogenated amorphous silicon, which includes chlorine distributed in a manner which produces a predetermined photoconductivity and a predetermined field-effect mobility in the active region. Preferably, the active region includes a plurality of hydrogenated amorphous silicon layers, at least one of which includes chlorine. In one embodiment, the plurality of hydrogenated amorphous silicon layers includes a hydrogenated amorphous silicon layer including between 0.1 ppm and 106 ppm chlorine. In another embodiment, the plurality of hydrogenated amorphous silicon layers includes a first hydrogenated amorphous silicon layer having a first chlorine concentration and a second hydrogenated amorphous silicon layer having a second chlorine concentration less than the first chlorine concentration. The first hydrogenated amorphous silicon layer includes 1 ppm to 105 ppm chlorine, and the second hydrogenated amorphous silicon layer includes less than 104 ppm chlorine. Related fabrication methods are also discussed.

38 Claims, 9 Drawing Sheets

THIN-FILM SWITCHING DEVICE HAVING CHLORINE-CONTAINING ACTIVE REGION AND METHODS OF FABRICATION THEREFOR

FIELD OF THE INVENTION

The present invention relates to microelectronic switching devices and methods of fabrication therefor, more particularly, to thin-film switching devices and methods of fabrication therefor.

BACKGROUND OF THE INVENTION

Thin film transistors (TFTs) are commonly used to drive pixel electrodes of liquid crystal elements of liquid crystal displays (LCDs). A TFT typically includes an active region comprising amorphous silicon, polysilicon or CdSe. Active regions formed of hydrogenated amorphous silicon (a-Si:H) have particular advantages for mass production and production of large-screen displays. Typical goals in the design of an a-Si:H TFT include increasing the field-effect mobility and reducing off current under backlight illumination. However, since a-Si:H typically has a high photoconductivity, high levels of leakage current may occur under backlight conditions. The leakage current can be especially large in a projection display using high-intensity backlighting. Thus, it is particularly desirable to decrease photo leakage current in a-Si:H TFT in order to obtain a high quality TFT-LCD.

A conventional method for reducing the photo leakage current by reducing the thickness of an undoped a-Si:H layer is described in an article entitled "*A 33 cm-Diagonal High-Resolution Multi-color TFT-LCD with Fully Self-Aligned a-Si:HTFTs,*" by N.Hirano et al, IDRC 94, pp. 369–371 (1994). Though photo leakage current can be slightly lowered by this method, this approach may also decrease field-effect mobility.

SUMMARY OF THE INVENTION

In light of the foregoing, it is an object of the present invention to provided thin-film switching devices and methods of fabrication therefor which provide reduced photoconductivity and improved field-effect mobility characteristics.

This and other objects, features and advantages are provided according to the present invention by thin-film switching devices and methods of fabrication therefor in which a thin-film switching device is formed having an active region including noncrystalline silicon, e.g., hydrogenated amorphous silicon, which includes chlorine distributed in a manner which produces a predetermined photoconductivity and field-effect mobility. More preferably, the active region includes a plurality of hydrogenated amorphous silicon layers, at least one of which includes chlorine. In an embodiment according to the invention, an active region of a thin-film switching device includes a hydrogenated amorphous silicon layer including a concentration of chlorine which reduces photoconductivity combined with another hydrogenated amorphous silicon layer which has a lower concentration of chlorine which can improve field-effect mobility.

Including chlorine in the active region can reduce the photoconductivity of the region, thus potentially reducing leakage current under backlit conditions. By properly distributing the chlorine, reduced photoconductivity characteristics can be achieved without requiring significant reduction in field effect mobility. When switching devices according to the present invention are used to control liquid crystal display elements of a liquid crystal display, improved operation under backlit conditions can be achieved.

In particular, according to the present invention, a thin-film switching device includes an active region including noncrystalline silicon which includes chlorine distributed in a manner which produces a predetermined photoconductivity and a predetermined field-effect mobility in the active region.

Preferably, the active region includes a plurality of hydrogenated amorphous silicon layers, at least one of which includes chlorine. In one embodiment, the plurality of hydrogenated amorphous silicon layers includes a hydrogenated amorphous silicon layer including between 0.1 ppm and 106 ppm chlorine. In another embodiment, the plurality of hydrogenated amorphous silicon layers includes a first hydrogenated amorphous silicon layer having a first chlorine concentration and a second hydrogenated amorphous silicon layer having a second chlorine concentration less than the first chlorine concentration. The first hydrogenated amorphous silicon layer includes 1 ppm to 105 ppm chlorine, and the second hydrogenated amorphous silicon layer includes less than 104 ppm chlorine.

According to another embodiment, a thin-film switching device includes a substrate, an insulated gate electrode on the substrate, an active region on the insulated gate electrode, the active region including noncrystalline silicon including chlorine, and spaced-apart source/drain electrodes on the active region. The insulated gate may include a first conductive region on the substrate and an insulation region covering the first conductive region. The active region may include an active region on the insulation region, overlying the first conductive region. The spaced apart source/drain electrodes may include spaced apart first and second ohmic contact regions on the active region, disposed on opposite sides of the conductive region, and spaced apart second and third conductive regions on respective ones of the spaced apart first and second ohmic contact regions. Preferably, the active region includes chlorine distributed in a manner which produces a predetermined photoconductivity and a predetermined fieldeffect mobility in the active region. More preferably, the active layer includes a plurality of hydrogenated amorphous silicon layers, at least one of which includes chlorine.

According to method aspects, a noncrystalline silicon active region is formed for a thin-film switching device, the active region including chlorine distributed in a manner which produces a predetermined photoconductivity and a predetermined field-effect mobility in the active region. Preferably, the active region is formed by forming a plurality of hydrogenated amorphous silicon layers, at least one of which includes chlorine.

The plurality of hydrogenated amorphous silicon layers may be formed by exposing a substrate to a silicon gas to form a hydrogenated amorphous silicon layer, and exposing the substrate to a mixture including a silicon gas and a chlorinated silicon gas to form a hydrogenated amorphous silicon layer including chlorine, both steps preferably using a plasma enhanced chemical vapor deposition process. Exposing the substrate to a mixture including a silicon gas and a chlorinated silicon gas may include exposing the substrate to a chlorinated silicon gas selected from the group consisting of $SiCl_4$, $SiH_2Cl_2$, and $SiHCl_3$. Exposing the substrate to a mixture including a silicon gas and a chlorinated silicon gas may include exposing the substrate to a silicon gas selected from the group consisting of $SiH_4$, $SiH_4/H_2$, $Si_2H_6$, $Si_2H_6/He$, and $Si_2H_6/H_2$. Exposing the substrate to a mixture including a silicon gas and a chlorinated silicon gas includes the step of exposing the substrate to a mixture including a chlorinated silicon gas selected from the group consisting of $SiCl_4$, $SiH_2Cl_2$, and $SiHCl_3$ and a silicon gas selected from the group consisting of $SiH_4$, $SiH_4/H_2$, $Si_2H_6$, $Si_2H_6/He$, and $Si_2H_6/H_2$. The chlorinated silicon gas and the silicon gas may be provided to the substrate at respective first and second mass flow rates such that the ratio of the first mass flow rate to the second mass flow rate is between 0.0001 and 0.6.

According to other method aspects, a plurality of hydrogenated amorphous silicon layers may be formed by exposing a substrate to a mixture of a silicon gas and a chlorinated silicon gas to form a first hydrogenated amorphous silicon layer including less than 104 ppm chlorine, and exposing the substrate to a mixture including a silicon gas and a chlorinated silicon gas to form a second hydrogenated amorphous silicon layer including 1–105 ppm chlorine. The first hydrogenated amorphous silicon layer may be formed by providing the chlorinated silicon gas and the silicon gas to the substrate at respective first and second mass flow rates such that the ratio of the first mass flow rate to the second mass flow rate is less than 0.4. The second hydrogenated amorphous silicon layer may be formed by providing the chlorinated silicon gas and the silicon gas to the substrate at respective third and fourth mass flow rates such that the ratio of the third mass flow rate to the fourth mass flow rate is between 0.001 and 0.5. The mixture may include a chlorinated silicon gas selected from the group consisting of $SiCl_4$, $SiH_2Cl_2$, and $SiHCl_3$ and a silicon gas selected from the group consisting of $SiH_4$, $SiH_4/H_2$, $Si_2H_6$, $Si_2H_6/He$, and $Si_2H_6/H_2$.

According to other method aspects, a thin-film switching device is fabricated by forming an insulated gate electrode on a substrate, forming an active region on the insulated gate electrode, the active region including noncrystalline silicon which includes chlorine, and forming spaced-apart source/drain electrodes on the active region. The active region preferably is formed by forming a hydrogenated amorphous silicon region including chlorine distributed in a manner which produces a predetermined photoconductivity and a predetermined field-effect mobility in the active region, more preferably, by forming a plurality of hydrogenated amorphous silicon layers, at least one of which includes chlorine. Thin-film switching devices which offer improved photoconductivity characteristics may thereby be provided.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
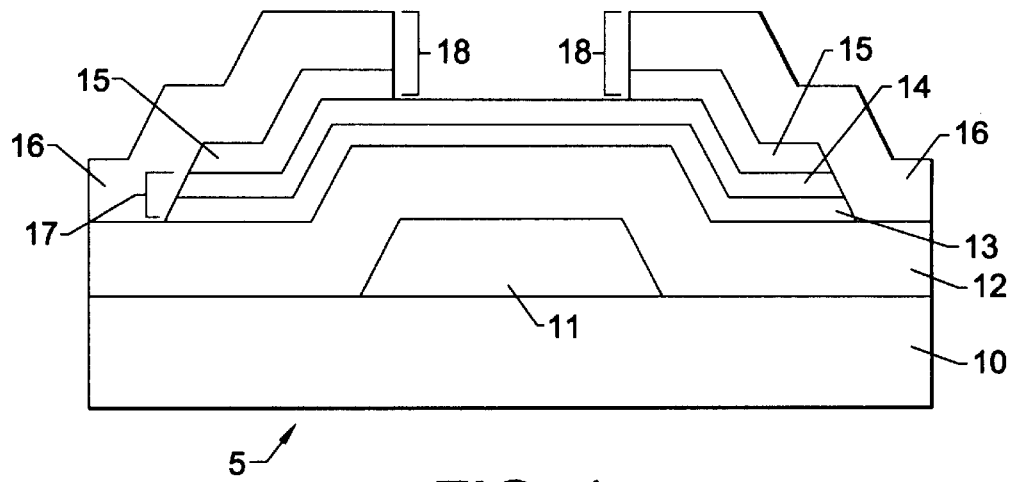
FIG. 1 is a sectional view of an inverted staggered thin film transistor (TFT) according to the present invention.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. It will also be understood that when a layer is referred to as being "on" a substrate, it can be directly on the layer or substrate, or intervening layers may also be present. "Switching device" as used refers to devices which conduct electric current through an active region under control of one or more electrodes, e.g., thin-film transistors (TFTs) and the like. In the drawings, the thickness of layers and regions are exaggerated for clarity, and like numbers refer to like elements throughout.

A Thin Film Switching Device

FIG. 1 illustrates an inverted staggered thin film switching device, e.g., a thin-film transistor (TFT), according to the present invention. Referring to FIG. 1, a gate electrode 11 and an insulation layer 12 are stacked on an insulation substrate 10. An active region 17 with a double layer structure including a lower active layer 13 and an upper active layer 14, is formed on the insulation layer 12. Spaced apart source/drain electrodes 18, including conductive regions 16 and ohmic contact regions 15, are formed on a predetermined area of the upper active layer 14. In embodiments according to the present invention, the active region 17 has a two-layer structure including a hydrogenated amorphous silicon (a-Si:H) layer and a 0.1 ppm to 106 ppm chlorine-containing hydrogenated amorphous silicon layer (a-Si:H(:Cl)). The chlorine-containing hydrogenated amorphous silicon layer (a-Si:H(:Cl)) may be either the lower layer 13 or the upper layer 14.

According to a theory of operation which does not limit the scope of the invention, the presence of chlorine in the a-Si:H(:Cl) layer may lead to breaking of Si-H bond and Si-Si bonds having relatively low bond energies. This may shift the Fermi level of the layer in direction which lowers the photo-conductivity of the layer. The characteristics of the thin film switching device may be improved by controlling the concentration of chlorine to provide different levels in the various active layers. For example, the upper active layer 14 may include a concentration of chlorine which lowers off-current, the highly incorporated chlorine decreasing the photo-conductivity of the upper active layer 14. The chlorine concentration of the lower active layer 13 may then be controlled to produce a lower chlorine concentration which improves field-effect mobility and threshold voltage. According to one embodiment, one of the active layers may be formed of a-Si:H(:Cl) containing 0 ppm to 104 ppm chlorine, and the other active layer may be formed of a-Si:H(:Cl) containing 1 ppm to 105 ppm chlorine.

Those skilled in the art will appreciate that although a two-layer active region is illustrated, other structures may be used within the scope of the invention. For example, structure including more than two active layers may be used. In addition to structures including discrete active layers with respective chlorine concentrations, a single hydrogenated amorphous silicon layer may be formed which has a graduated chlorine concentration profile. Similarly, structures other than the inverted staggered structure illustrated in FIG. 1 may be utilized with the invention, including, for example, planar or inverted planar structures.

Fabrication Methods for TFTs

Referring now to FIG. 1, a first conductive layer, e.g., a chromium (Cr) or aluminum (Al) layer, is formed on an insulation substrate 10 and then patterned to form a conductive region 11. An insulation layer 12 is then formed on the resultant structure using, for example, a monolayer structure of silicon nitride or a stacked structure such as a silicon oxide ($SiO_2$)/silicon nitride ($SiN_x$) structure or an aluminum oxide ($Al_2O_3$)/silicon nitride ($SiN_x$) structure.

A hydrogenated amorphous silicon (a-Si:H) layer 13 is then formed on the insulation layer, preferably to a thickness of 100Å to 200 Å, by exposing the structure to a gas selected from the group consisting of $SiH_4$, $SiH_4/H_2$, $Si_2H_6$ and $Si_2H_6$/He gases at a mass flow rate of 0.1 sccm to 10 sccm, at a temperature of 150° C. to 350° C. A 0.1 ppm to 106 ppm chlorine-containing hydrogenated amorphous silicon layer 14 (a-Si:H(:Cl) layer) is then formed on the a-Si:H layer 13, preferably to a thickness of 500 Å to 2,500 Å, by exposing the structure to a gas mixture including a silicon gas selected from the group consisting of $SiH_4$, $SiH_4/H_2$, $Si_2H_6$, $Si_2H_6$/He and $Si_2H_6/H_2$, and a chlorinated silicon gas selected from the group consisting of $SiCl_4$, $SiH_2Cl_2$ and $SiHCl_3$. The silicon source gas preferably is flowed at 0.1 sccm to 10 sccm, and the chlorinated silicon gas is preferably flowed at 0.00001 to 6 sccm. Subsequently, an $n^+$-amorphous silicon layer or $n^+$-microcrystalline silicon layer may be formed on the a-Si:H(:Cl) layer 14 and patterned to form ohmic contact regions 15. A conductive layer, e.g., aluminum, chrome or the like, may then be formed on the ohmic contact regions 15, and patterned to form spaced apart conductive regions 16, thereby forming a thin-film transistor 5.

According to another method aspect, a thin film switching device is formed including a lower active layer 13 made of a-Si:H(:Cl) containing 0 ppm to 104 ppm chlorine, and an upper active layer 14 made of a-Si:14(:Cl) containing 1 ppm to 105 ppm chlorine. After sequentially forming the gate electrode 11 and the insulation layer 12 on the insulation substrate 10 in the same manner as described above, a lower active layer 13 containing 0 ppm to 104 ppm chlorine is formed with 100 Å to 700 Å thickness by exposing the structure to a gas mixture including a silicon gas selected from the group consisting of $SiH_4$, $SiH_4/H_2$, $Si_2H_6$, $Si_2H_6$/He and $Si_2H_6/H_2$, and chlorinated silicon gas selected from the group consisting of $SiCl_4$, $SiH_2Cl_2$ and $SiHCl_3$. The silicon gas is flowed at mass flow rate of 0.1 sccm to 10 sccm, and the chlorinated silicon gas is flowed at a mass flow rate of 0 sccm to 4 sccm. After forming the lower active layer 13, the flow rate of the chlorinated silicon gas is changed to 0.0001 sccm to 5 sccm to form the upper active layer 14 containing 1 ppm to 105 ppm chlorine with a 500 Å to 2,500 Å thickness. Ohmic contact regions 15 and conductive regions 16 are then formed on the upper active layer 14 as described above.

Those skilled in the art will appreciate that variations of the abovedescribed operations may also be used within the scope of the invention. For example, instead of forming discrete layers with respective chlorine concentrations, a hydrogenated amorphous silicon active layer may be formed with a graduated chlorine concentration by varying the flow rates of the deposition gases in situ during formation of the layer.

Control of Chlorine Content

Investigation into the effect of flow rate on chlorine content of an Si:H(:Cl) layer was conducted by forming an amorphous silicon layer insulation substrate while varying the flow-rate ratio of $SiH_2Cl_2/SiH_4$ gases, and measuring the chlorine content within the amorphous silicon layer using secondary ion mass spectrometry (SIMS). Results are illustrated in FIG. 2, in which the chlorine content for flow-rate ratios of $SiH_2Cl_2$ gas to $SiH_4$ gas of 0.2, 0.1 and 0 is represented by a dashed line, a dot-and-dashed line and a solid line, respectively.

Figure 2:
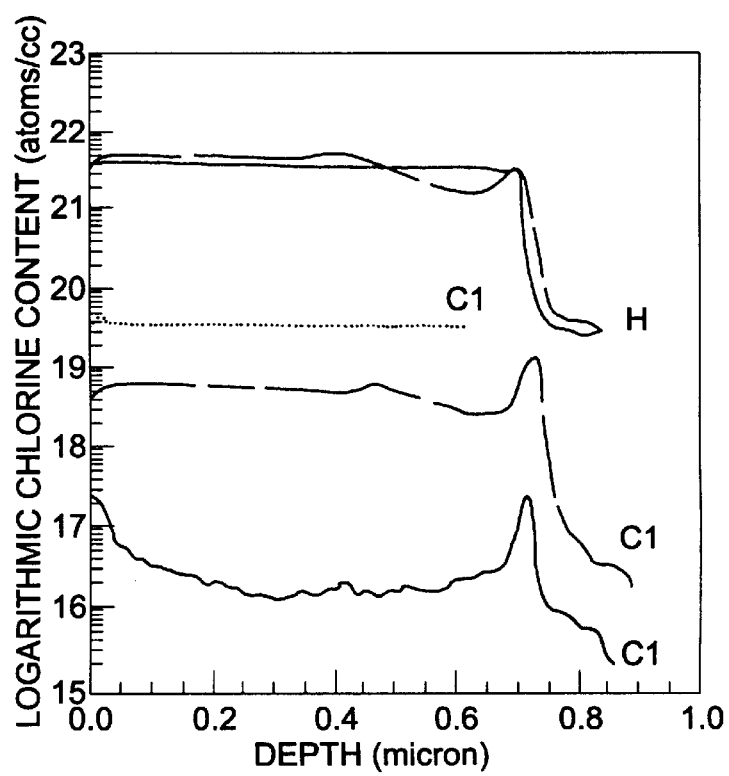
FIG. 2 is a graph illustrating a relationship between of flow-rate ratio of $SiH_2Cl_2$ gas to $SiH_4$ gas and chlorine content of an amorphous silicon layer.

As illustrated in FIG. 2, when the flow-rate ratio of $SiH_2Cl_2/SiH_4$ was 0.1 and 0.2, the content of chlorine was $7 \times 10^{18}$ $cm^{-3}$ and $4 \times 10^{19}$ $cm^{-3}$, respectively, indicating that chlorine content in the amorphous silicon layer increases as the flow-rate ratio of $SiH_2Cl_2/SiH_4$ increases. FIG. 2 also illustrates that chlorine may still be present even when the flow-rate ratio of $SiH_2Cl_2/SiH_4$ is reduced to 0, possibly because of outgassing of chlorine from the reaction chamber wall during the deposition process.

Drain Current vs. Gate Voltage Characteristics

In order to investigate conductivity in a thin film switching device fabricated according to the present invention, drain current vs. gate voltage characteristics of devices were measured. A thin film switching device having an active layer formed of a-Si:H with a 1,500 Å thickness, and a thin film switching device having an active layer formed of a-Si:H(:Cl) with 1,500 Å thickness were used as control groups 1 and 2, respectively. A thin film switching device having a lower active layer made of a-Si:H(:Cl) with a 500 Å thickness and an upper active layer made of a-Si:H with a 1,000 Å thickness, and a thin film switching device having a lower active layer made of a-Si:H with a 500 Å thickness and an upper active layer made of a-Si:H(:Cl) with a 1,000 Å thickness were used as experimental groups 1 and 2, respectively. The drain current vs. gate voltage characteristics of the control and experimental groups were measured, and are shown in FIGS. 3 through 6.

Figure 3:
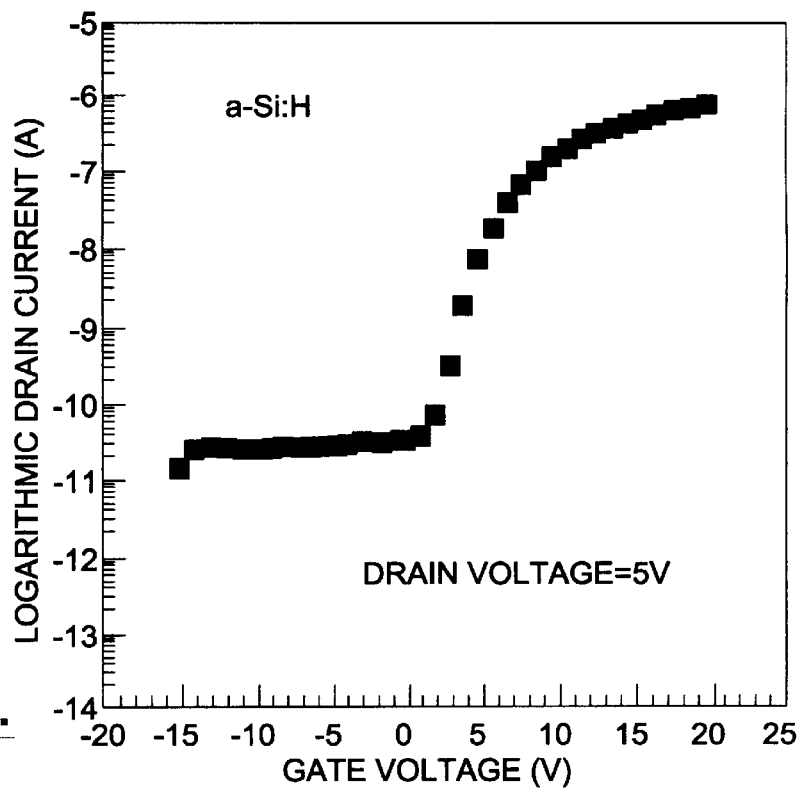
FIGS. 3 and 4 are graphs illustrating drain current vs. gate voltage characteristics of a control groups of TFTs.
Figure 4:
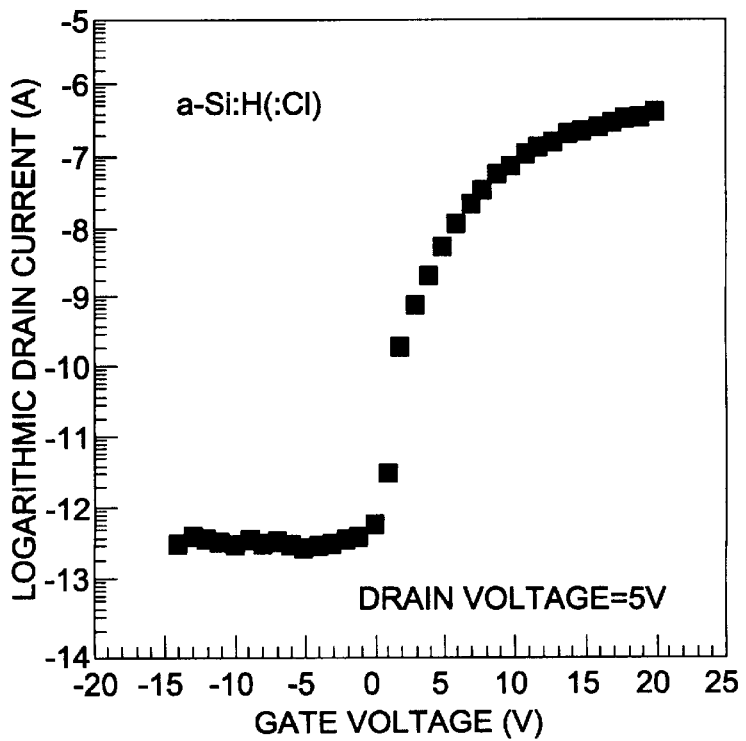
Figure 5:
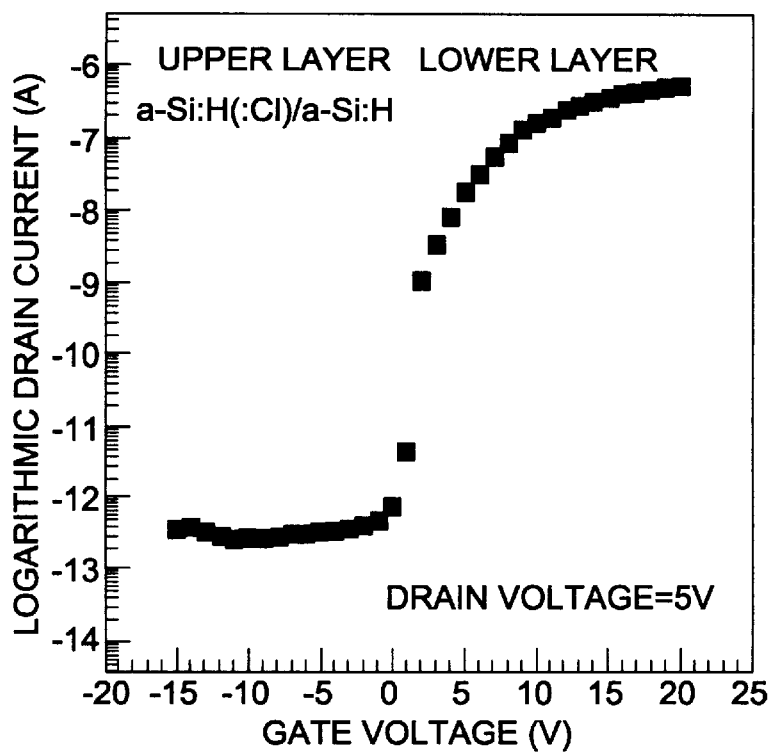
FIGS. 5 and 6 are graphs illustrating drain current vs. gate voltage characteristics of experimental groups of TFTs.
Figure 6:
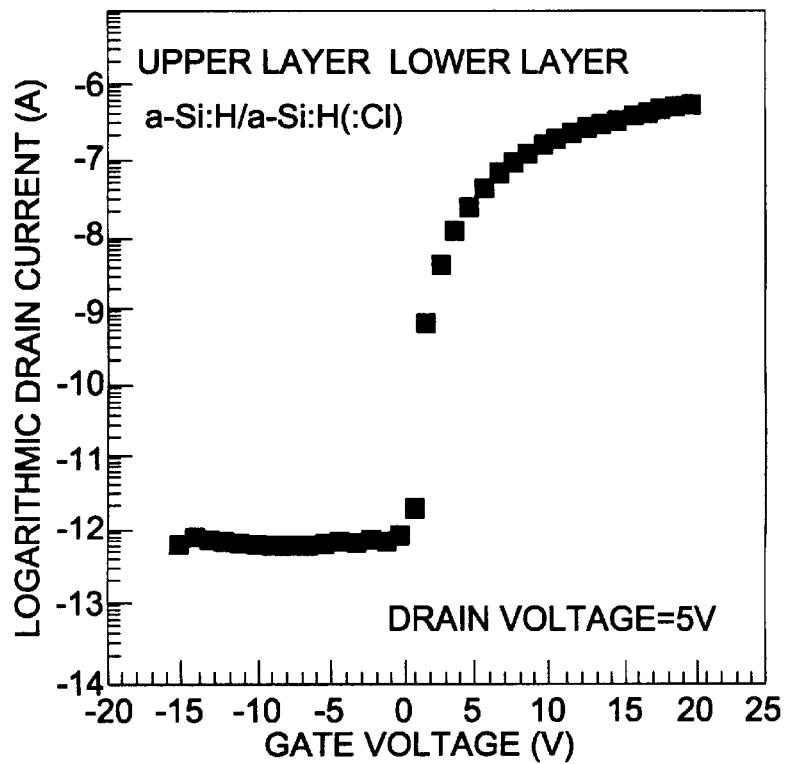

Referring to FIGS. 3 and 4, the off-current of control group 2 appears to be decreased with respect to control group 1 by a factor of about 1/10. As shown in FIGS. 5 and 6, experimental groups 1 and 2 appear to exhibit a similarly low off-current, even though the part of the active layer is only partially formed of a-Si:H(:Cl). As also illustrated by FIGS. 4 and 5, each subthreshold slope of experimental groups 1 and 2 is about 0.45 V/dec and the on/off current ratio is $10^6$ or more.

Field-effect Mobility

Field-effect mobility of the control and experimental groups was also measured, and is displayed in FIGS. 7 through 11. The field-effect mobility was calculated using the equation:

$$\sqrt{I_D} = [\mu_{FE}(W/L)C_i(V_G - V_{TH})V_D]^{1/2}$$

Figure 7:
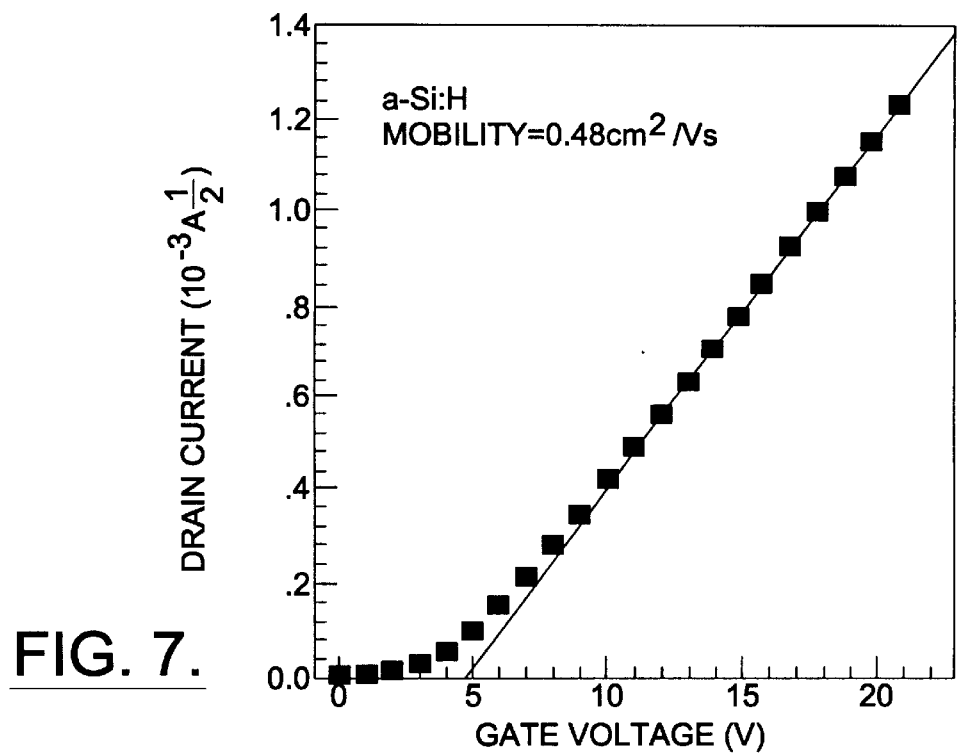
FIGS. 7 and 8 are graphs illustrating field-effect mobility characteristics of control groups of TFTs.
Figure 8:
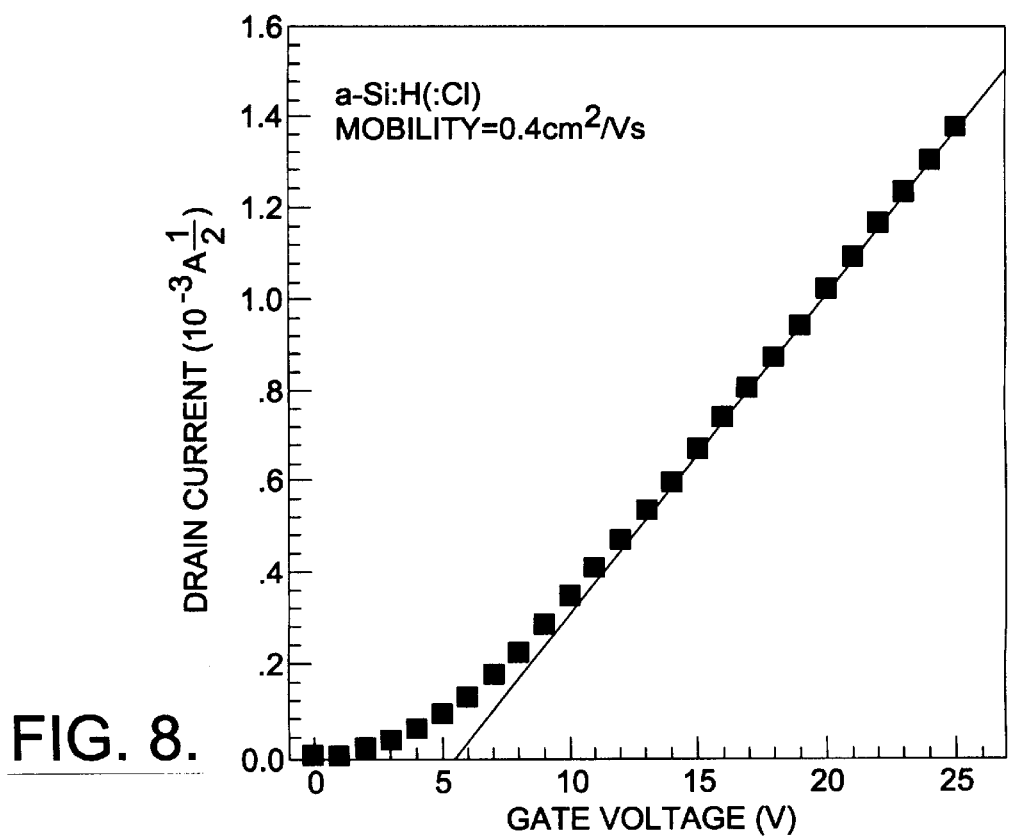
Figure 9:
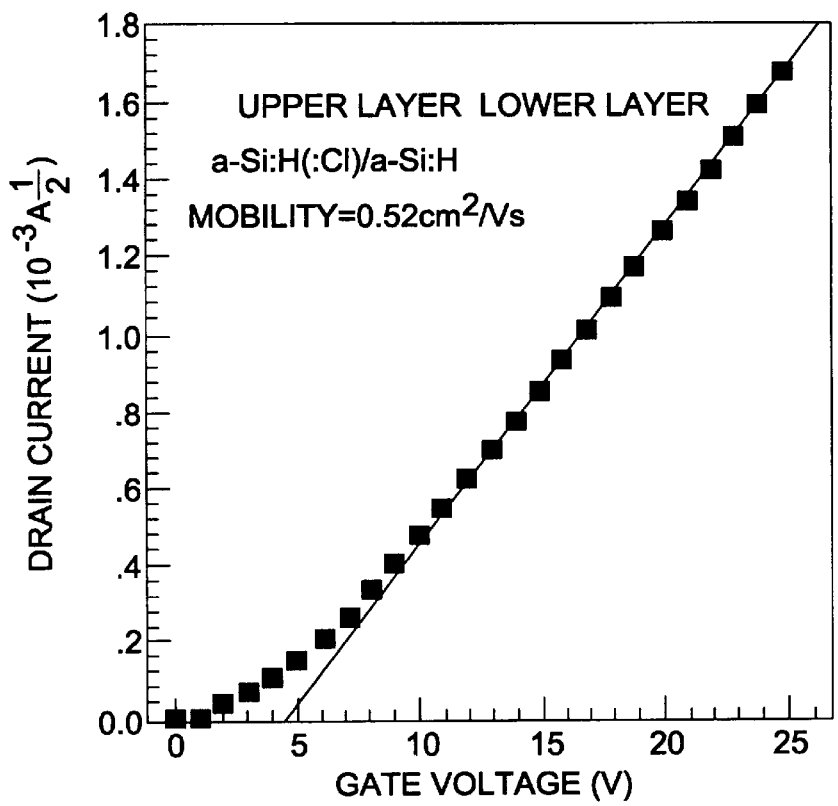
FIGS. 9 and 10 are graphs illustrating field-effect mobility characteristics of experimental groups of TFTs.
Figure 10:
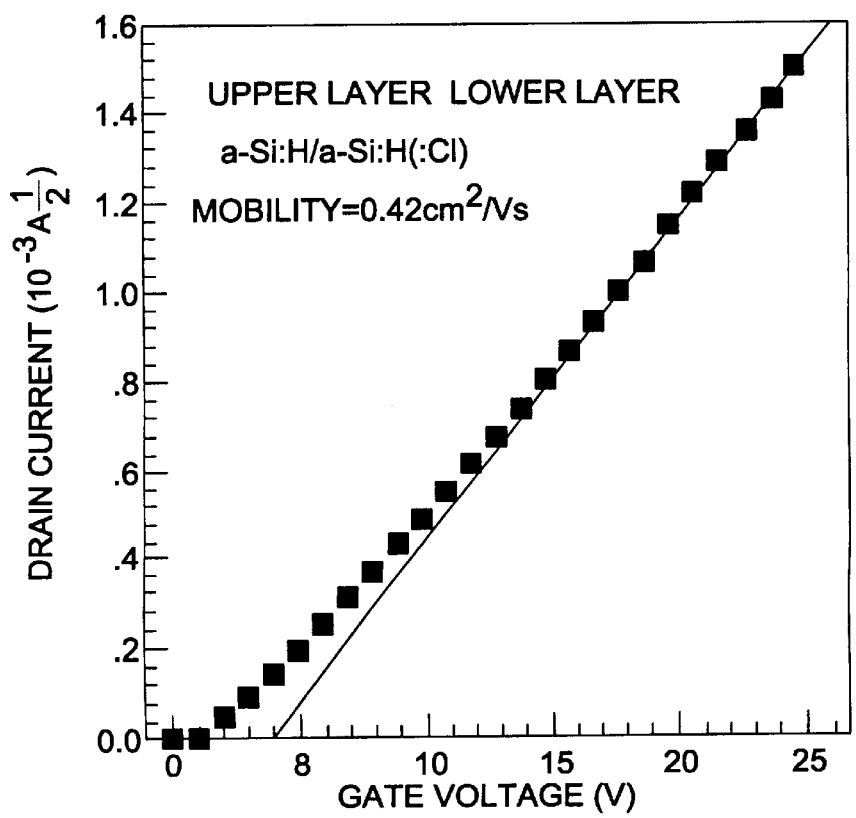

As illustrated in FIG. 7, the field-effect mobility of control group 1 is around 0.48 $cm^2/Vs$, while the field-effect mobility of control group 2, illustrated in FIG. 8, is around 0.40 $cm^2/Vs$, indicating that incorporated chlorine in a-Si:H(:Cl) can reduce field-effect mobility. Experimental groups 1 and 2 exhibit field-effect mobility of 0.52 cm$^2$/Vs and 0.42 cm$^2$/Vs, respectively, indicating a improved mobility in comparison to devices including a single active layer formed of only a-Si:H(:Cl). The field-effect mobility level of experimental groups 1 and appear to be similar to that of switching devices of control group 1, even though experimental groups 1 and 2 include a-Si:H(:Cl).

Output Characteristics

The output characteristics of each group were also measured, producing the results shown in FIGS. 11 through 14. Here, width (W) and length (L) of the active layers of all groups were 60 μm and 30 μm, respectively.

Figure 11:
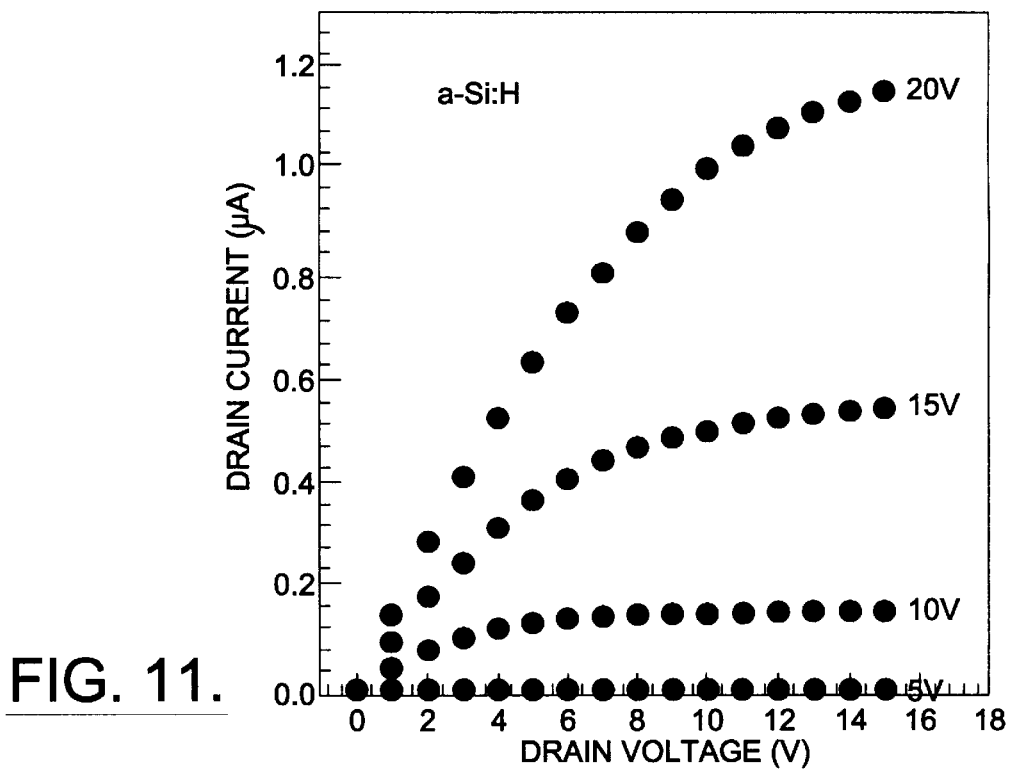
FIGS. 11 and 12 are graphs illustrating output characteristics of control roups of TFTs.
Figure 12:
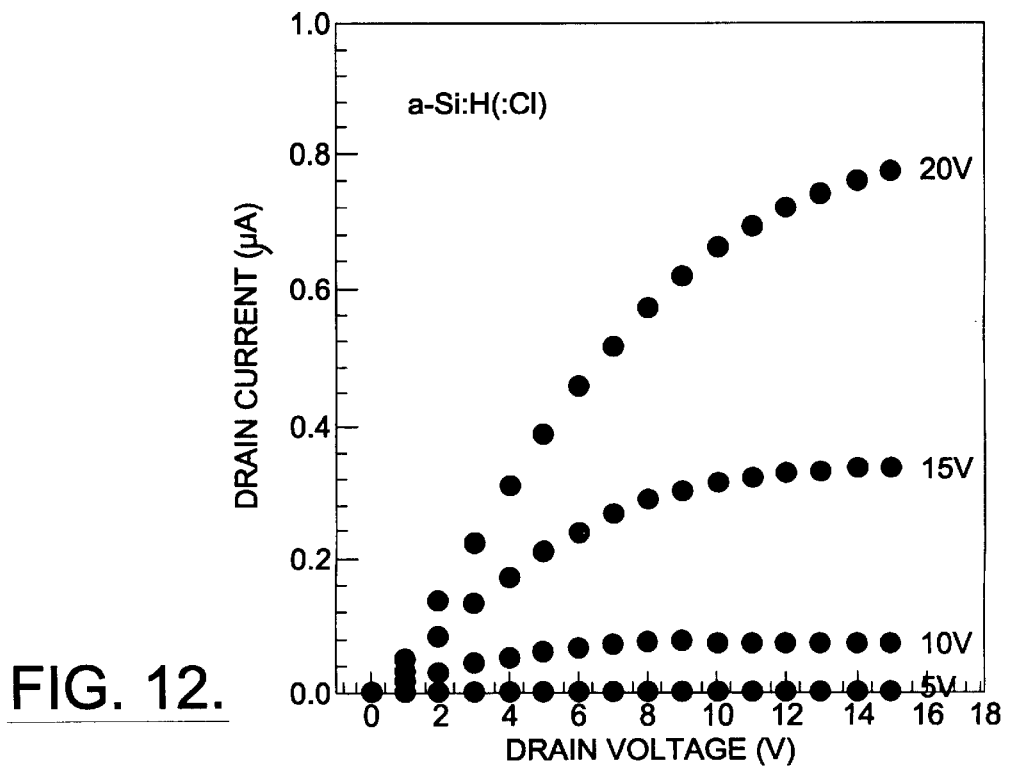

In FIG. 11, the drain current of control group 1 is saturated at 1.12×10$^{-6}$ A, given a gate voltage of 20 V. The drain current of control group 2 is saturated at 0.76×10$^{-6}$ A, given a gate voltage of 20 V, as is illustrated in FIG. 12, indicating that when the active layer is formed of only a-Si:H(:Cl) (control group 2), the saturation level of the drain current may be sharply decreased.

Figure 13:
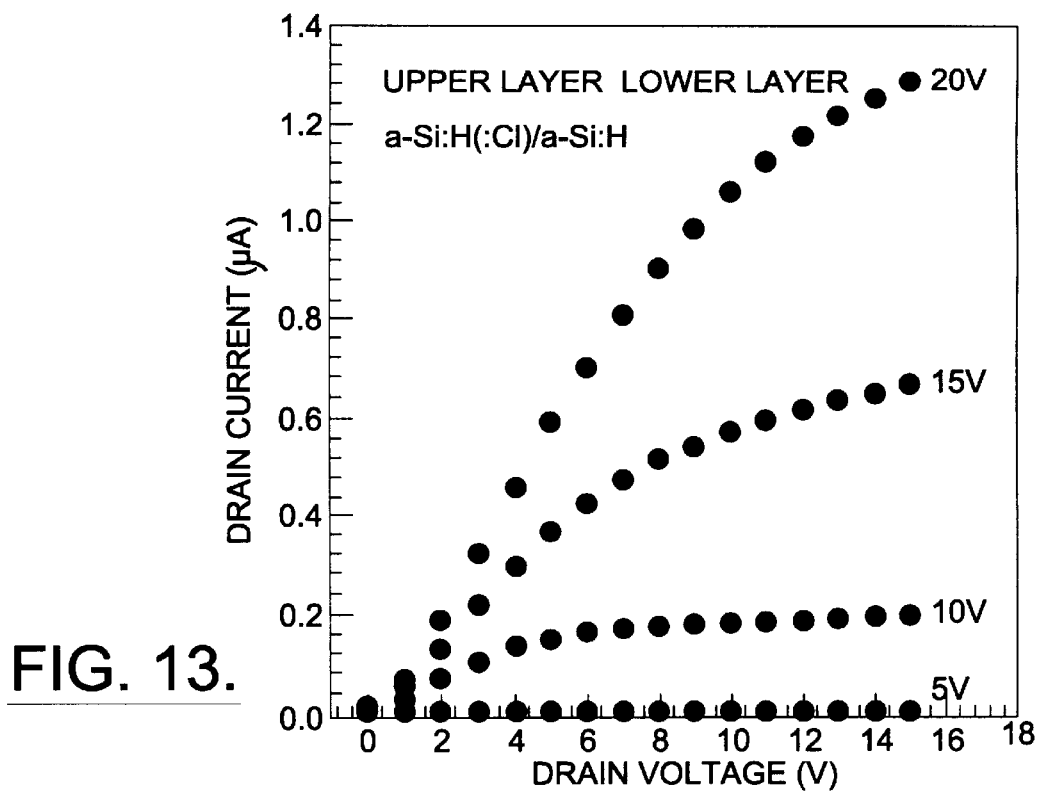
FIGS. 13 and 14 are graphs illustrating output characteristics of experimental groups of TFTs.
Figure 14:
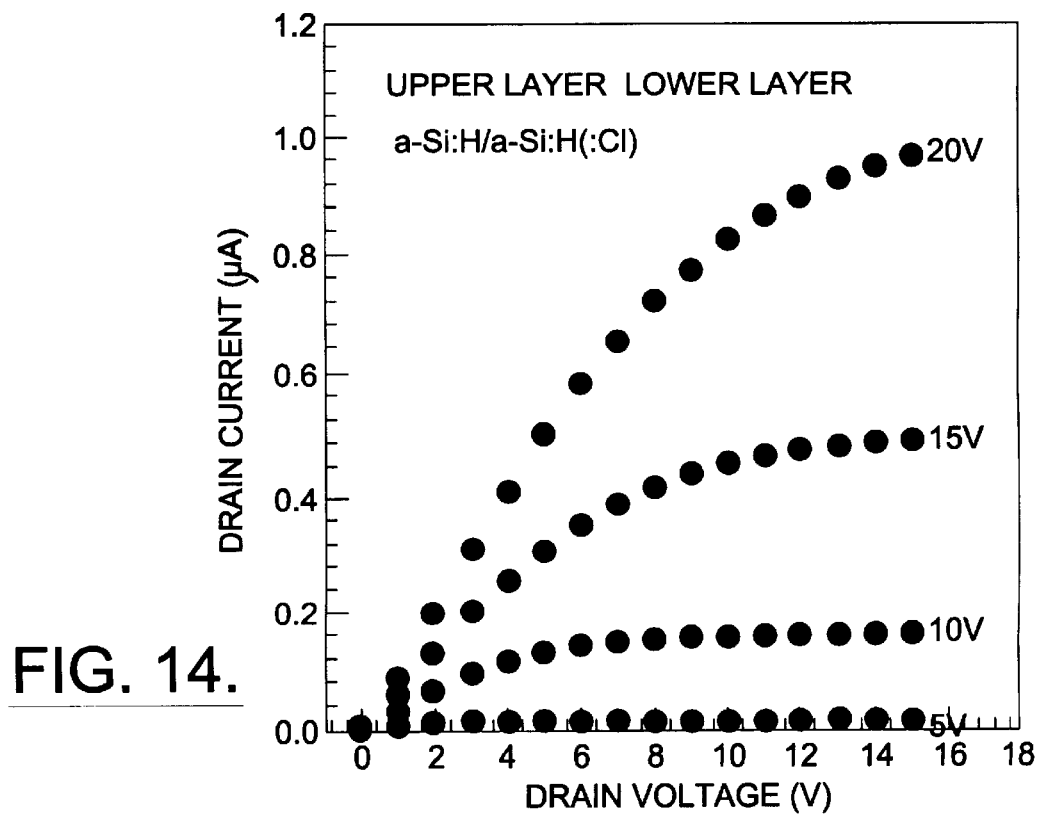

In contrast, as can be seen in FIGS. 13 and 14, drain currents of experimental groups 1 and 2 are saturated at 1.30×10$^{-6}$ A and 0.96×10$^{-6}$ A, respectively, given a gate voltage of 20 V. Thus, according to the present invention, the output characteristics of thin-film switching device may be improved according to the present invention, especially for thin film switching devices including an lower active layer made of a-Si:H(:Cl) and an upper active layer made of a-Si:H (experimental group 1).

Effect of Flow-rate Ratio of SiH$_2$Cl$_2$ Gas to SiH$_4$ Gas on Dark-conductivity and Photo-conductivity In order to observe the relationship between the chlorine content within the active layer and the conductivity under both dark and illuminated conditions, a relationship between mass flow rate and conductivity under both dark and illuminated conditions was measured by varying the flow-rate ratio of SiH$_2$Cl$_2$/SiH$_4$ gases in a range from 0 to 0.12. The conductivity under the illumination was measured at 100 mW/cm$^2$, producing the results shown in FIG. 15.

Figure 15:
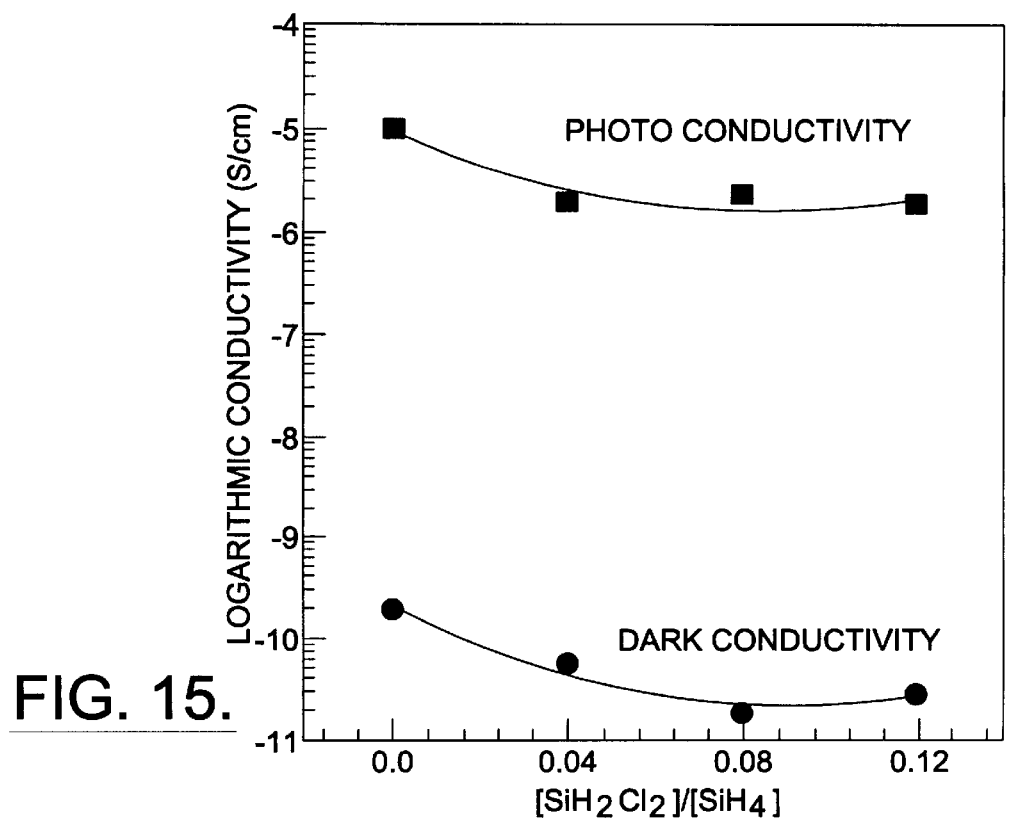
FIG. 15 is a graph illustrating relationships between flow-rate ratio of $SiH_2Cl_2$ gas to $SiH_4$ gas and dark-conductivity and photo-conductivity of an morphous silicon layer.

As shown in FIG. 15, the flow-rate ratio of SiH$_2$Cl$_2$/SiH$_4$ appears to bear an inverse relationship to dark-conductivity or photo-conductivity. It may be postulated that the decrease in the dark-conductivity and photo-conductivity is due to a Fermi level shift as the chlorine content increases.

Transfer Characteristics

Figure 16:
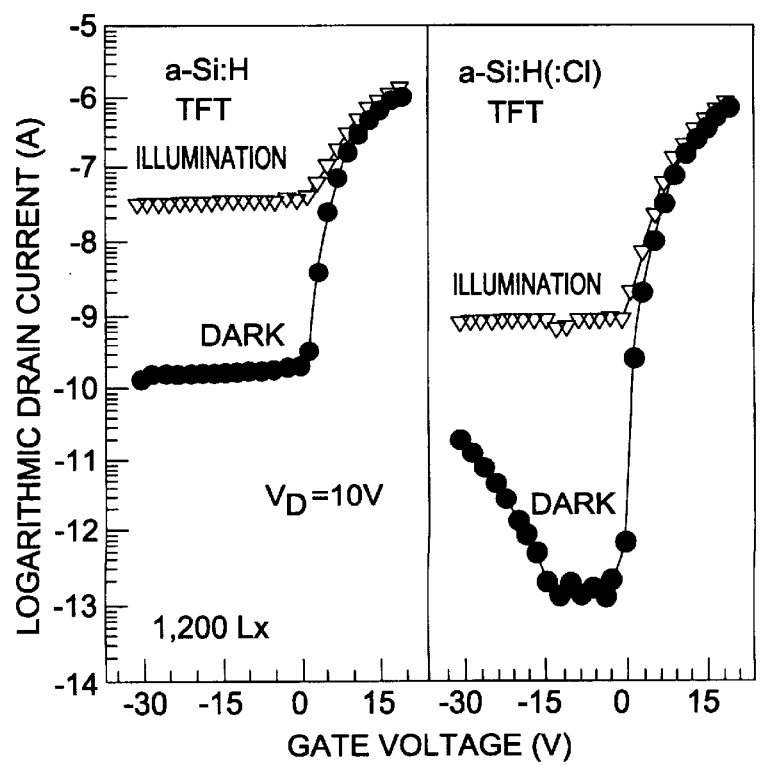
FIG. 16 is a graph illustrating transfer characteristics of control groups of TFTs.
Figure 17:
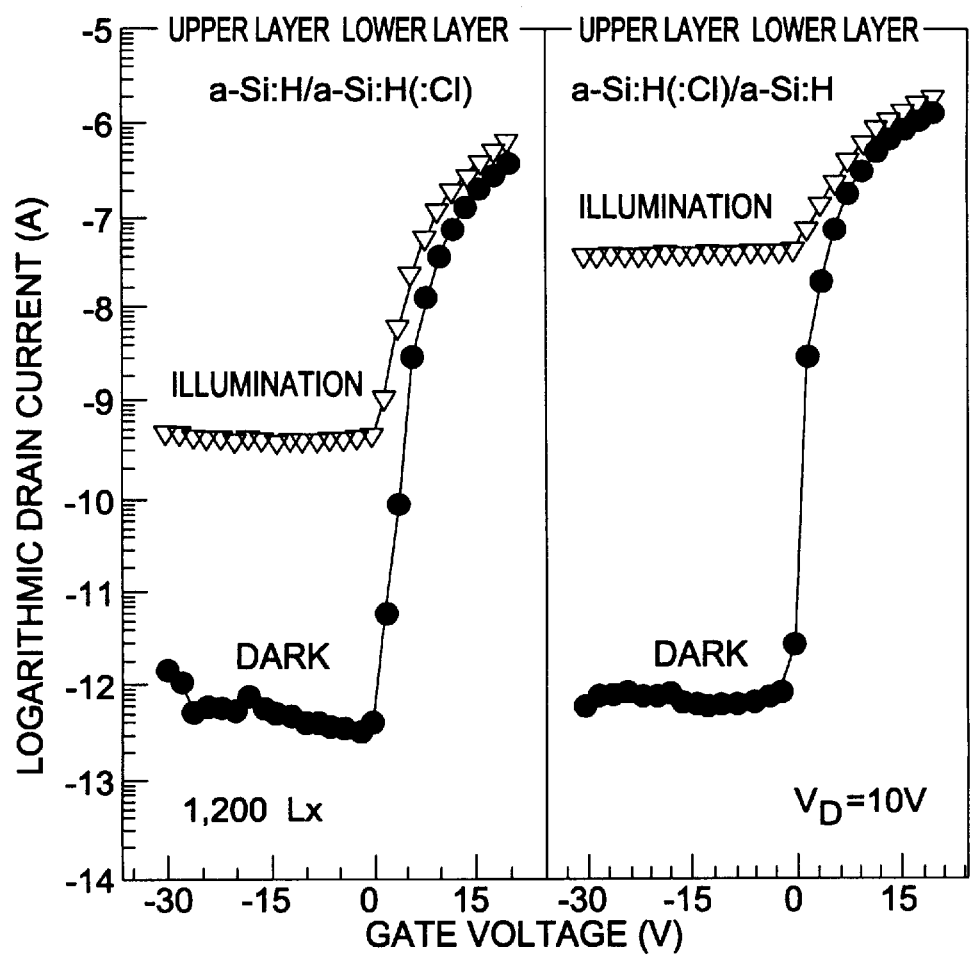
FIG. 17 is a graph illustrating transfer characteristics of experimental groups of TFTs.

Transfer characteristics under the dark and illuminating conditions of each group were also compared, producing the results shown in FIGS. 16 and 17. For purposes of the testing, channels of each thin film switching device were illuminated with 1200Lx of light.

Referring to FIG. 16, the off-current of control group 2 appears lower than that of control group 1 by about 1/100, under illuminated conditions. As can be seen in FIG. 17, the off-current of experimental group 2 (having the lower active layer made of the a-Si:H and the upper active layer made of the a-Si:H(:Cl)) appears to be decreased by about 1/100 compared to the off current of control group 1,indicating that photo leakage-current can be decreased without significantly decreasing threshold voltage.

In sum, an improved thin-film switching device can be achieved when the active layer of the device includes chlorine distributed in a manner which reduces photoconductivity without significantly effecting field-effect mobility and threshold voltage, e.g, when the active layer includes multiple layers including a-Si:H layer and an a-Si:H(:Cl) layer. Accordingly, when such switching devices are used as switching elements for liquid crystal display elements of a liquid crystal display (LCD), leakage current under backlit conditions can be reduced, improving the performance of the LCD.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A thin-film switching device, comprising:
   an active region comprising noncrystalline silicon which includes chlorine that is nonuniformly vertically distributed in a manner which produces a photoconductivity and a field-effect mobility in said active region which includes chlorine that is nonuniformly vertically distributed.

2. A device according to claim 1, wherein said active region comprises a plurality of noncrystalline silicon layers, at least one of which comprises chlorine.

3. A device according to claim 2, wherein said plurality of noncrystalline layers includes a plurality of hydrogenated amorphous silicon layers, at least one of which comprises chlorine.

4. A device according to claim 3, wherein said plurality of hydrogenated amorphous silicon layers comprises a hydrogenated amorphous silicon layer including between 0.1 ppm and 106 ppm chlorine.

5. A device according to claim 3, wherein said plurality of hydrogenated amorphous silicon layers comprises a first hydrogenated amorphous silicon layer having a first chlorine concentration and a second hydrogenated amorphous silicon layer having a second chlorine concentration less than said first chlorine concentration.

6. A device according to claim 5:
   wherein said first hydrogenated amorphous silicon layer comprises 1 ppm to 105 ppm chlorine; and
   wherein said second hydrogenated amorphous silicon layer comprises less than 104 ppm chlorine.

7. A thin-film switching device, comprising:
   a substrate;
   an insulated gate electrode on said substrate;
   an active region on said insulated gate electrode, said active region comprising noncrystalline silicon which includes chlorine that is nonuniformly vertically distributed therein; and
   laterally spaced-apart source/drain electrodes on said active region which includes chlorine that is nonuniformly vertically distributed therein.

8. A device according to claim 7:
   wherein said insulated gate comprises:
      a first conductive region on said substrate; and
      an insulation region covering said first conductive region;
   wherein said active region comprises an active region on said insulation region, overlying said first conductive region; and
   wherein said spaced apart source/drain electrodes comprise:
      spaced apart first and second ohmic contact regions on said active region, disposed on opposite sides of said conductive region; and
      spaced apart second and third conductive regions on respective ones of said spaced apart first and second ohmic contact regions.

9. A device according to claim 8, wherein said active region comprises chlorine distributed in a manner which produces a photoconductivity and a field-effect mobility in said active region.

10. A device according to claim 8, wherein said active region comprises a plurality of hydrogenated amorphous silicon layers, at least one of which comprises chlorine.

11. A device according to claim 10, wherein said plurality of hydrogenated amorphous silicon layers comprises a hydrogenated amorphous silicon layer including between 0.1 ppm and 106 ppm chlorine.

12. A device according to claim 10, wherein said plurality of hydrogenated amorphous silicon layers comprises a first hydrogenated amorphous silicon layer having a first chlorine concentration and a second hydrogenated amorphous silicon layer having a second chlorine concentration less than said first chlorine concentration.

13. A device according to claim 12:
wherein said first hydrogenated amorphous silicon layer comprises 1 ppm to 105 ppm chlorine; and
wherein said second hydrogenated amorphous silicon layer comprises less than 104 ppm chlorine.

14. A method of fabricating an active region for a thin-film switching device, the method comprising the step of:
forming a noncrystalline silicon active region including chlorine that is nonuniformly vertically distributed in a manner which produces a photoconductivity and a field-effect mobility in the active region which includes chlorine that is nonuniformly vertically distributed therein.

15. A method according to claim 14, wherein said step of forming an active region comprises the step of:
forming a plurality of noncrystalline silicon layers, at least one of which includes chlorine.

16. A method according to claim 15, wherein said step of forming an active region comprises the step of:
forming a plurality of hydrogenated amorphous silicon layers, at least one of which includes chlorine.

17. A method according to claim 16, wherein said step of forming a plurality of hydrogenated amorphous silicon layers comprises the steps of:
exposing a substrate to a silicon gas to form a hydrogenated amorphous silicon layer; and
exposing the substrate to a mixture including a silicon gas and a chlorinated silicon gas to form a hydrogenated amorphous silicon layer including chlorine.

18. A method according to claim 17:
wherein said step of exposing a substrate to a silicon gas comprises the step of exposing the substrate to a silicon gas according to a plasma enhanced chemical vapor deposition process; and
wherein said step of exposing the substrate to a mixture including a silicon gas and a chlorinated silicon gas comprises the step of exposing the substrate to a mixture including a silicon gas and a chlorinated silicon gas according to a plasma enhanced chemical vapor deposition process.

19. A method according to claim 18, wherein said step of exposing the substrate to a mixture including a silicon gas and a chlorinated silicon gas comprises the step of exposing the substrate to a chlorinated silicon gas selected from the group consisting of $SiCl_4$, $SiH_2Cl_2$, and $SiHCl_3$.

20. A method according to claim 18, wherein said step of exposing the substrate to a mixture including a silicon gas and a chlorinated silicon gas comprises the step of exposing the substrate to a silicon gas selected from the group consisting of $Si_4$, $SiH_4/H_2$, $Si_2H_6$, $Si_2H_6/He$, and $Si_2H_6/H_2$.

21. A method according to claim 18, wherein said step of exposing the substrate to a mixture including a silicon gas and a chlorinated silicon gas comprises the step of exposing the substrate to a mixture comprising:

a chlorinated silicon gas selected from the group consisting of $SiCl_4$, $SiH_2Cl_2$, and $SiHCl_3$; and
a silicon gas selected from the group consisting of $SiH_4$, $SiH_4/H_2$, $Si_2H_6$, $Si_2H_6/He$, and $Si_2H_6/H_2$.

22. A method according to claim 21, wherein said step of exposing the substrate to a mixture including a silicon gas and a chlorine gas comprises the steps of:
providing the chlorinated silicon gas and the silicon gas to the substrate at respective first and second mass flow rates such that the ratio of the first mass flow rate to the second mass flow rate is between 0.0001 and 0.6.

23. A method according to claim 16, wherein said step of forming a plurality of hydrogenated amorphous silicon layers comprises the steps of:
exposing a substrate to a mixture of a silicon gas and a chlorinated silicon gas to form a first hydrogenated amorphous silicon layer including less than 104 ppm chlorine; and
exposing the substrate to a mixture including a silicon gas and a chlorinated silicon gas to form a second hydrogenated amorphous silicon layer including 1–105 ppm chlorine.

24. A method according to claim 23:
wherein said step of exposing a substrate to a mixture of a silicon gas and a chlorinated silicon gas to form a first hydrogenated amorphous silicon layer including less than 104 ppm chlorine comprises the step of providing the chlorinated silicon gas and the silicon gas to the substrate at respective first and second mass flow rates such that the ratio of the first mass flow rate to the second mass flow rate is less than 0.4; and
wherein said step of exposing the substrate to a mixture including a silicon gas and a chlorinated silicon gas to form a second hydrogenated amorphous silicon layer including 1–105 ppm chlorine comprises the step of providing the chlorinated silicon gas and the silicon gas to the substrate at respective third and fourth mass flow rates such that the ratio of the third mass flow rate to the fourth mass flow rate is between 0.001 and 0.5.

25. A method according to claim 23, wherein said step of exposing a substrate to a mixture including a silicon gas and a chlorinated silicon gas to form a first hydrogenated amorphous silicon layer including less than 104 ppm chlorine comprises the step of exposing the substrate to a mixture comprising:
a chlorinated silicon gas selected from the group consisting of $SiCl_4$, $SiH_2Cl_2$, and $SiHCl_3$; and
a silicon gas selected from the group consisting of $SiH_4$, $SiH_4/H_2$, $Si_2H_6$, $Si_2H_6/He$, and $Si_2H_6/H_2$.

26. A method of fabricating a thin-film switching device, the method comprising the steps of:
forming an insulated gate electrode on a substrate;
forming an active region on the insulated gate electrode, the active region including hydrogenated amorphous silicon which includes chlorine that is nonuniformly vertically distributed therein; and
forming laterally spaced-apart source/drain electrodes on the active region which includes chlorine that is nonuniformly vertically distributed therein.

27. A method according to claim 26, wherein said step of forming an active region comprises the step of forming a hydrogenated amorphous silicon region including chlorine distributed in a manner which produces a photoconductivity and a field-effect mobility in the active region.

28. A method according to claim 27, wherein said step of forming an active region comprises the step of:

forming a plurality of hydrogenated amorphous silicon layers, at least one of which includes chlorine.

29. A method according to claim 28:

wherein said step of forming an insulated gate comprises the steps of:
  forming a first conductive region on said substrate; and
  forming an insulation region covering said first conductive region;

wherein said step of forming a plurality of hydrogenated amorphous silicon layers comprises the step of forming a plurality of hydrogenated amorphous silicon layers on the insulation region, overlying the first conductive region; and wherein said step of forming spaced apart source/drain electrodes comprises the steps of:
  forming spaced apart first and second ohmic contact regions on the plurality of hydrogenated amorphous silicon layers, disposed on opposite sides of said conductive region; and
  forming spaced apart second and third conductive regions on respective ones of said spaced apart first and second ohmic contact regions.

30. A method according to claim 29, wherein said step of forming a plurality of hydrogenated amorphous silicon layers comprises the steps of:

exposing the substrate to a silicon gas to form a hydrogenated amorphous silicon layer; and exposing the substrate to a mixture including a silicon gas and a chlorinated silicon gas to form a hydrogenated amorphous silicon layer including chlorine.

31. A method according to claim 30:

wherein said step of exposing the substrate to a silicon gas comprises the step of exposing the insulation region to a silicon gas to form a hydrogenated amorphous silicon layer on the insulation region; and wherein said step of exposing the substrate to a mixture including a silicon gas and a chlorinated silicon gas comprises the step of exposing the hydrogenated amorphous silicon layer to a mixture including a silicon gas and a chlorinated silicon gas to form a hydrogenated amorphous silicon layer including chlorine.

32. A method according to claim 30, wherein said step of exposing the substrate to a mixture including a silicon gas and a chlorinated silicon gas comprises the step of exposing the substrate to a chlorinated silicon gas selected from the group consisting of $SiCl_4$, $SiH_2Cl_2$, and $SiHCl_3$.

33. A method according to claim 30, wherein said step of exposing the substrate to a mixture including a silicon gas and a chlorinated silicon gas comprises the step of exposing the substrate to a silicon gas selected from the group consisting of $SiH_4$, $SiH_4/H_2$, $Si_2H_6$, $Si_2H_6/He$, and $Si_2H_6/H_2$.

34. A method according to claim 30, wherein said step of exposing the substrate to a mixture including a silicon gas and a chlorinated silicon gas comprises the step of exposing the substrate to a mixture comprising:

a chlorinated silicon gas selected from the group consisting of $SiCl_4$, $SiH_2Cl_2$, and $SiHCl_3$; and a silicon gas selected from the group consisting of $SiH_4$, $SiH_4/H_2$, $Si_2H_6$, $Si_2H_6/He$, and $Si_2H_6/H_2$.

35. A method according to claim 34, wherein said step of exposing the substrate to a mixture including a silicon gas and a chlorine gas comprises the steps of:

providing the chlorinated silicon gas and the silicon gas to the substrate at respective first and second mass flow rates such that the ratio of the first mass flow rate to the second mass flow rate is between 0.00001 and 0.6.

36. A method according to claim 29, wherein said step of forming a plurality of hydrogenated amorphous silicon layers comprises the steps of:

exposing the substrate to a mixture of a silicon gas and a chlorinated silicon gas to form a first hydrogenated amorphous silicon layer including less than 104 ppm chlorine; and exposing the substrate to a mixture including a silicon gas and a chlorinated silicon gas to form a second hydrogenated amorphous silicon layer including 1–105 ppm chlorine.

37. A method according to claim 36:

wherein said step of exposing a substrate to a mixture of a silicon gas and a chlorinated silicon gas to form a first hydrogenated amorphous silicon layer including less than 104 ppm chlorine comprises the step of providing the chlorinated silicon gas and the silicon gas to the substrate at respective first and second mass flow rates such that the ratio of the first mass flow rate to the second mass flow rate is less than 0.4; and wherein said step of exposing the substrate to a mixture including a silicon gas and a chlorinated silicon gas to form a second hydrogenated amorphous silicon layer including 1–105 ppm chlorine comprises the step of providing the chlorinated silicon gas and the silicon gas to the substrate at respective first and second mass flow rates such that the ratio of the first mass flow rate to the second mass flow rate is between 0.001 and 0.5.

38. A method according to claim 36, wherein said step of exposing a substrate to a mixture including a silicon gas and a chlorinated silicon gas to form a first hydrogenated amorphous silicon layer including less than 104 ppm chlorine comprises the step of exposing the substrate to a mixture comprising:

a chlorinated silicon gas selected from the group consisting of $SiCl_4$, $SiH_2Cl_2$, and $SiHCl_3$; and a silicon gas selected from the group consisting of $SiH_4$, $SiH_4/H_2$, $Si_2H_6$, $Si_2H_6/He$, and $Si_2H_6/H_2$.

* * * * *